(12) United States Patent
Lee

(10) Patent No.: US 9,859,259 B2
(45) Date of Patent: Jan. 2, 2018

(54) LIGHT EMITTING APPARATUS

(75) Inventor: Jae Hong Lee, Siheung (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 1448 days.

(21) Appl. No.: 11/908,102

(22) PCT Filed: Mar. 8, 2006

(86) PCT No.: PCT/KR2006/000801
§ 371 (c)(1),
(2), (4) Date: Sep. 7, 2007

(87) PCT Pub. No.: WO2006/098561
PCT Pub. Date: Sep. 21, 2006

(65) Prior Publication Data
US 2008/0164484 A1    Jul. 10, 2008

(30) Foreign Application Priority Data

Mar. 14, 2005   (KR) .................. 10-2005-0020846

(51) Int. Cl.
*H01L 29/20*    (2006.01)
*H01L 33/00*    (2010.01)
(Continued)

(52) U.S. Cl.
CPC ........ *H01L 25/0753* (2013.01); *H01L 33/501* (2013.01); *H01L 33/505* (2013.01);
(Continued)

(58) Field of Classification Search
CPC ....... H01L 33/62; H01L 33/647; H01L 23/50; H01L 23/5389; H01L 33/387; H01L 27/15
(Continued)

(56) References Cited

U.S. PATENT DOCUMENTS 6,297,598 B1 * 10/2001 Wang et al. ................ 315/169.3
6,335,548 B1 *  1/2002 Roberts et al. ................. 257/98
(Continued)

FOREIGN PATENT DOCUMENTS

| JP | 11045958 | 2/1999 |
|---|---|---|
| JP | 2003066287 | 3/2003 |

(Continued)

OTHER PUBLICATIONS

Final Office Action of U.S. Appl. No. 12/700,202 dated Oct. 14, 2011.
(Continued)

*Primary Examiner* — Jesse Y Miyoshi
(74) *Attorney, Agent, or Firm* — H.C. Park & Associates, PLC

(57) ABSTRACT

The present invention provides a light emitting apparatus comprising a three-color light emitting device unit including at least three light emitting diode (LED) chips for respectively emitting red, green and blue light; a white light emitting device unit including at least one blue LED chip with a fluorescent substance formed thereon; and a substrate provided with a first electrode connected in common to ends of the LED chips and second electrodes formed to correspond respectively to the LED chips. Further, the present invention provides a light emitting apparatus comprising a plurality of LED chips; a substrate provided with a first electrode connected in common to ends of the plurality of LED chips and second electrodes formed to correspond respectively to the plurality of LED chips; an upper package formed on the substrate to surround the plurality of LED chips and to have a partition crossing the first electrode at the center of the upper package; and a molding member that encapsulates the plurality of LED chips and is divided by the partition of the upper package.

15 Claims, 6 Drawing Sheets

(51) Int. Cl.
*H01L 25/075* (2006.01)
*H01L 33/56* (2010.01)
*H01L 33/50* (2010.01)

(52) U.S. Cl.
CPC ............ *H01L 33/507* (2013.01); *H01L 33/56* (2013.01); *H01L 33/50* (2013.01); *H01L 2224/48091* (2013.01); *H01L 2224/49113* (2013.01)

(58) Field of Classification Search
USPC ............................................ 257/98, 99, 100
See application file for complete search history.

(56) References Cited

U.S. PATENT DOCUMENTS

| | | | | |
|---|---|---|---|---|
| 6,476,410 | B2* | 11/2002 | Ishinaga | 257/13 |
| 6,636,003 | B2* | 10/2003 | Rahm et al. | 315/179 |
| 6,747,293 | B2* | 6/2004 | Nitta et al. | 257/99 |
| 6,914,267 | B2* | 7/2005 | Fukasawa et al. | 257/98 |
| 7,455,423 | B2 | 11/2008 | Takenaka | |
| 7,482,633 | B2 | 1/2009 | Chiaretti | |
| 7,700,964 | B2* | 4/2010 | Morimoto et al. | 257/98 |
| 2003/0214725 | A1* | 11/2003 | Akiyama | 359/640 |
| 2004/0056265 | A1 | 3/2004 | Arndt et al. | |
| 2004/0079957 | A1* | 4/2004 | Andrews et al. | 257/100 |
| 2006/0001055 | A1 | 1/2006 | Ueno et al. | |
| 2006/0065957 | A1 | 3/2006 | Hanya | |
| 2008/0259598 | A1 | 10/2008 | Sumitani et al. | |
| 2008/0296590 | A1* | 12/2008 | Ng | 257/88 |

FOREIGN PATENT DOCUMENTS

| | | | | |
|---|---|---|---|---|
| JP | 20030020245 | | 3/2003 | |
| JP | 2004127988 | | 4/2004 | |
| KR | 20030020245 | * | 3/2003 | ............ H01L 25/075 |

OTHER PUBLICATIONS

Non-Final Office Action of U.S. Appl. No. 12/700,202 dated May 12, 2011.
Non-Final Office Action of U.S. Appl. No. 12/700,202 dated May 10, 2012.
Non-Final Office Action of U.S. Appl. No. 12/700,202 dated Sep. 27, 2012.
Notice of Allowance dated Dec. 14, 2012 issued for U.S. Appl. No. 12/700,202.

* cited by examiner

[Fig. 1]
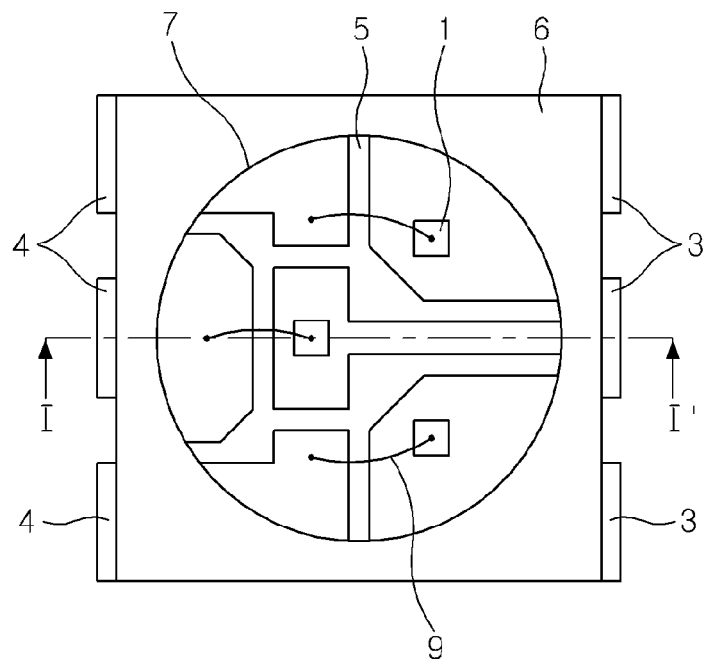
[Fig. 2]
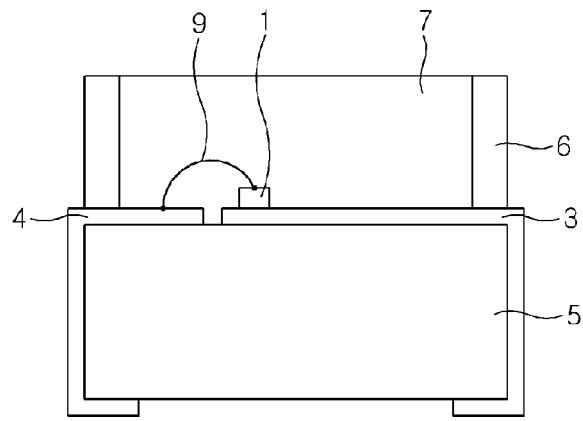
[Fig. 3]
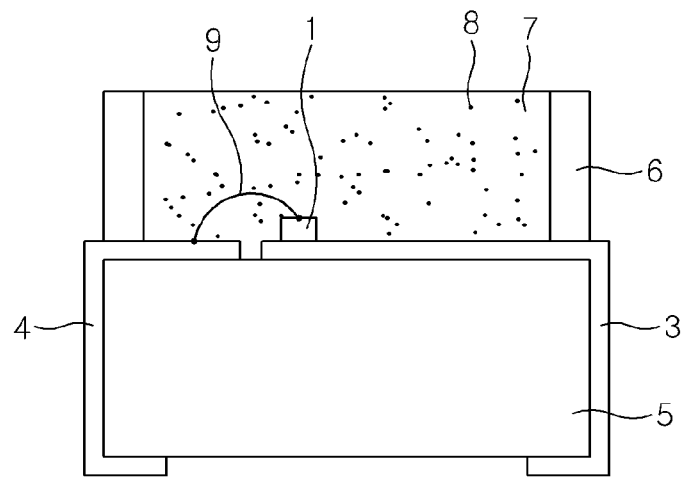

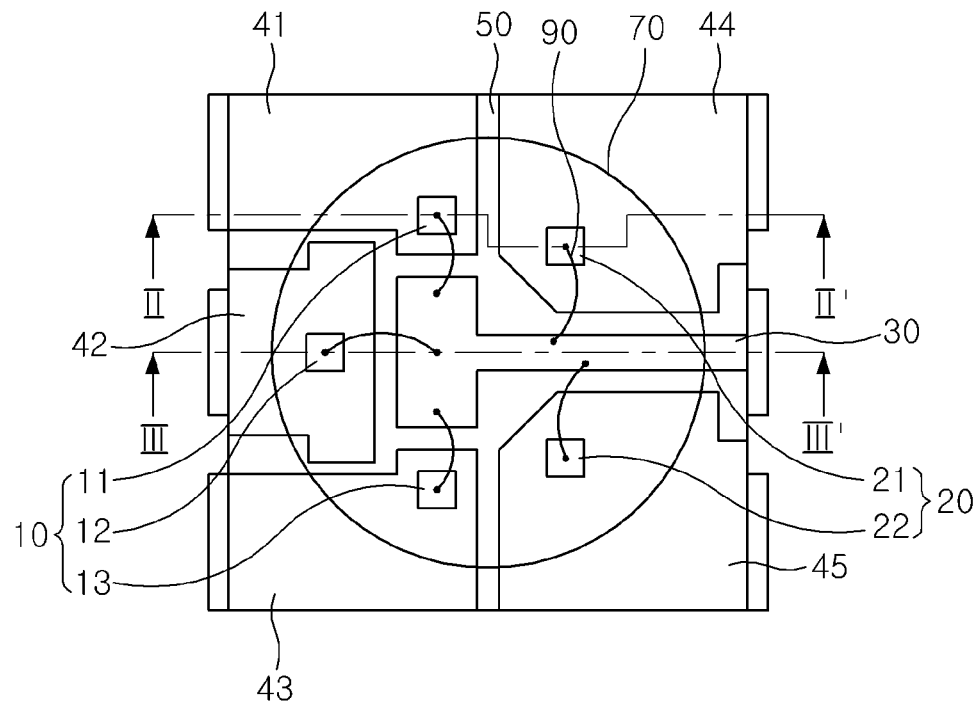
[Fig. 4]
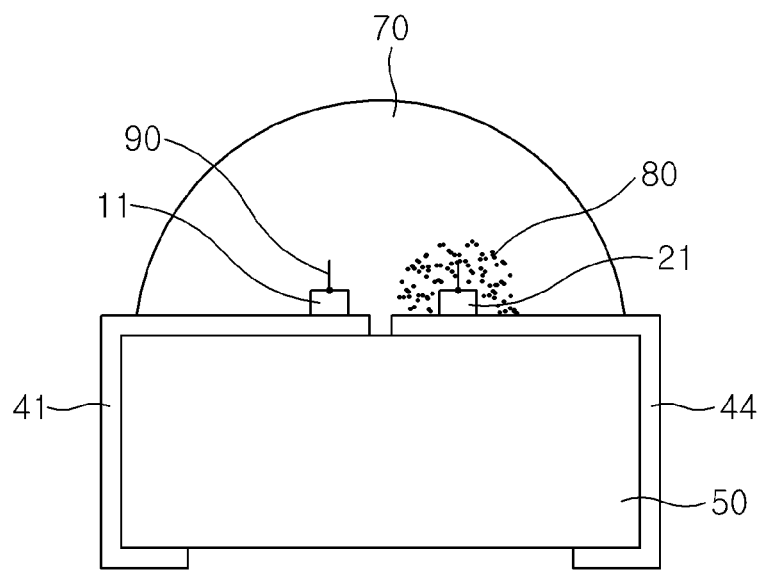
[Fig. 5]

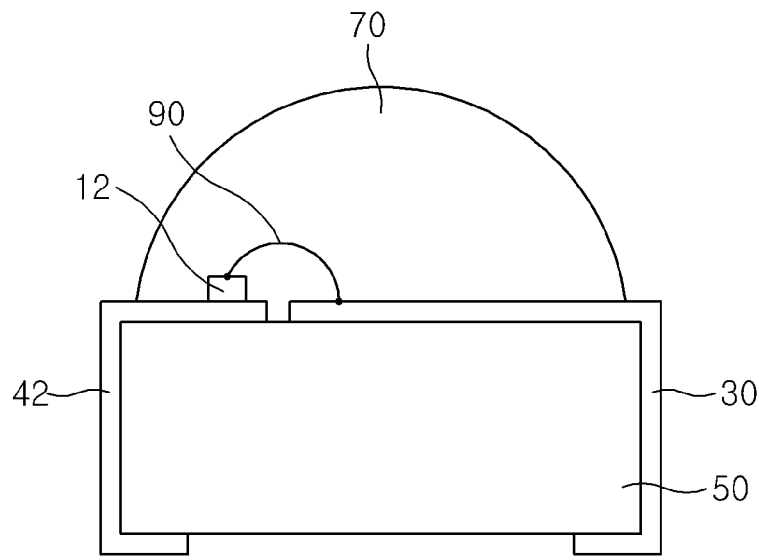
[Fig. 6]
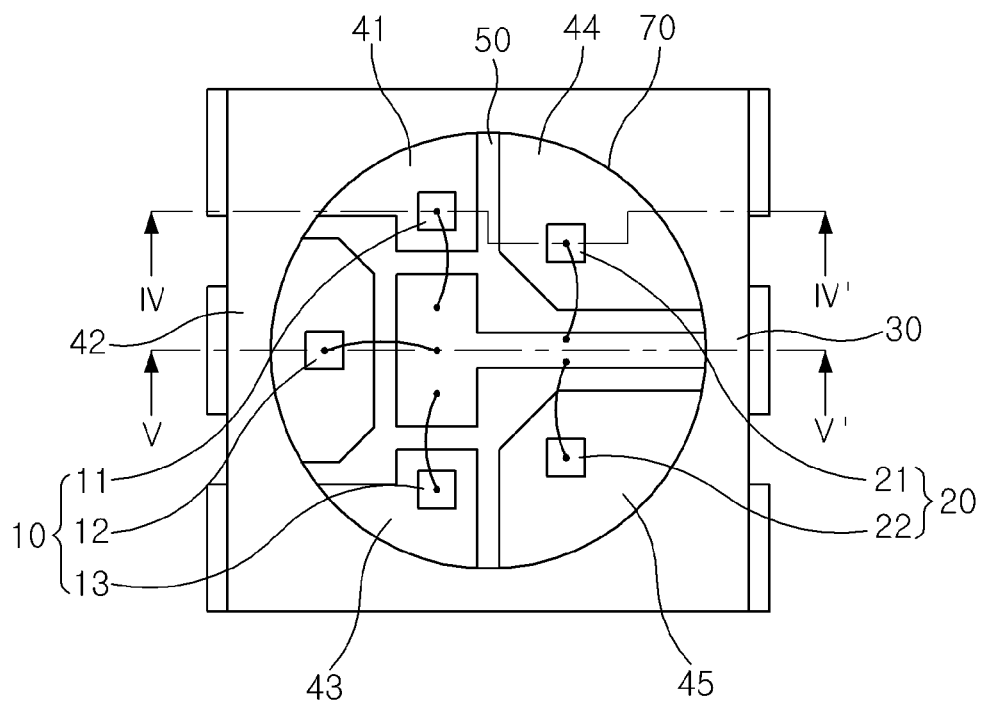
[Fig. 7]

[Fig. 8]
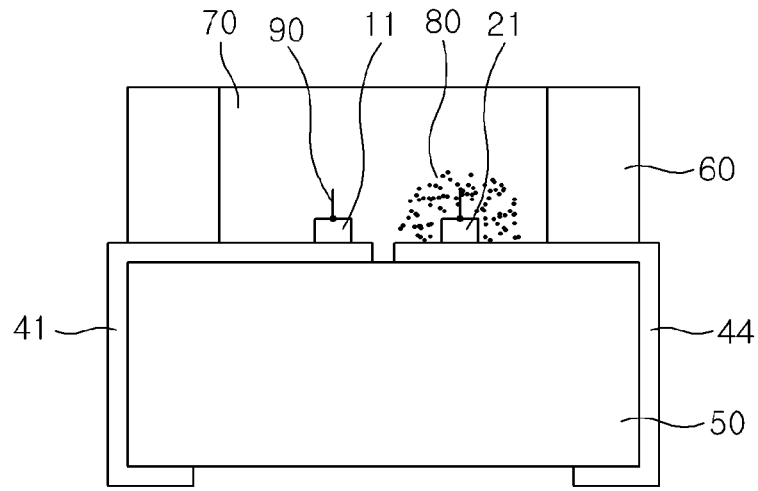
[Fig. 9]
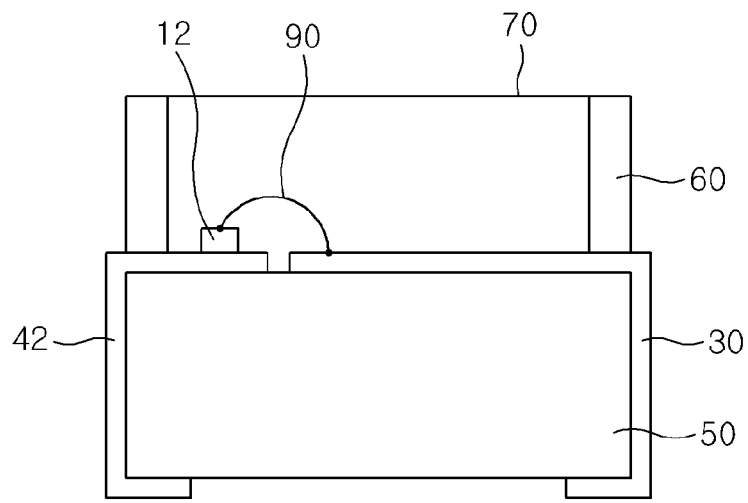
[Fig. 10]
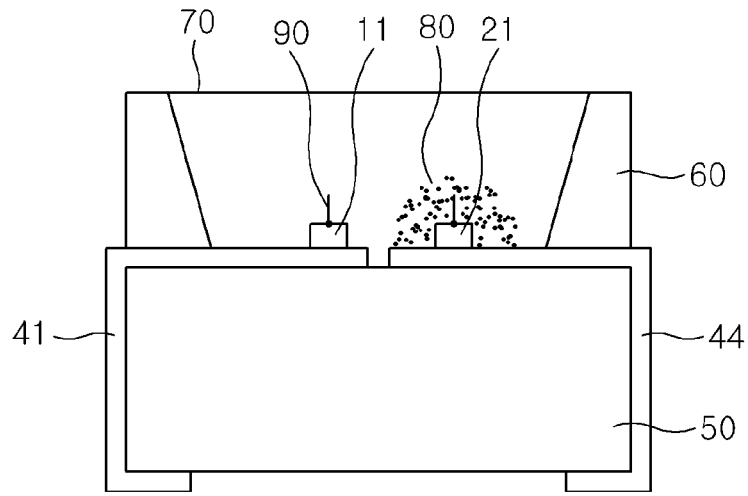

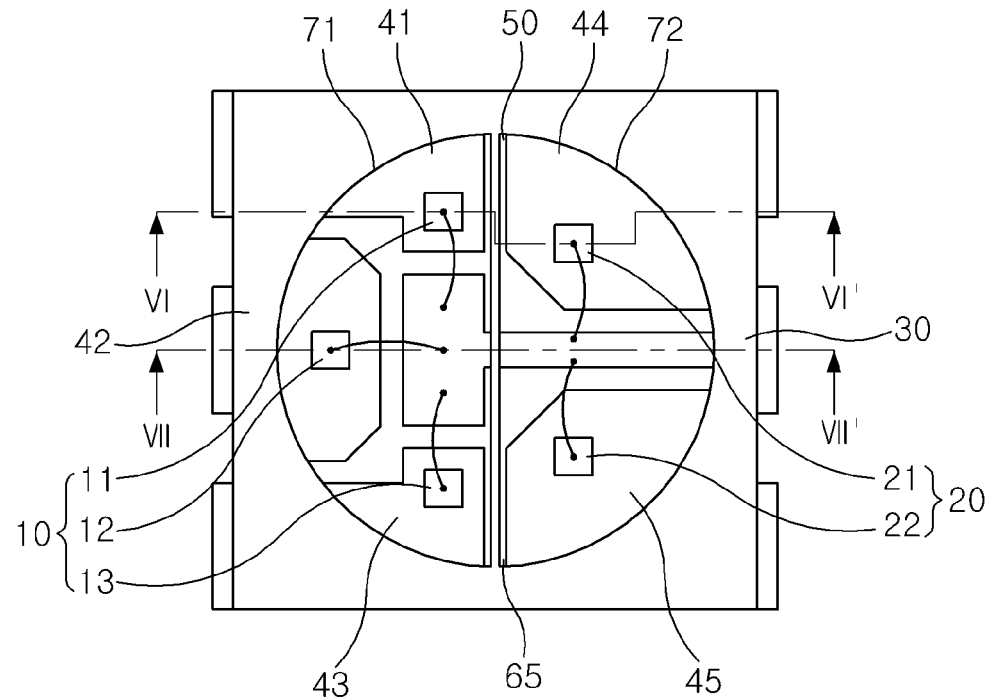
[Fig. 11]
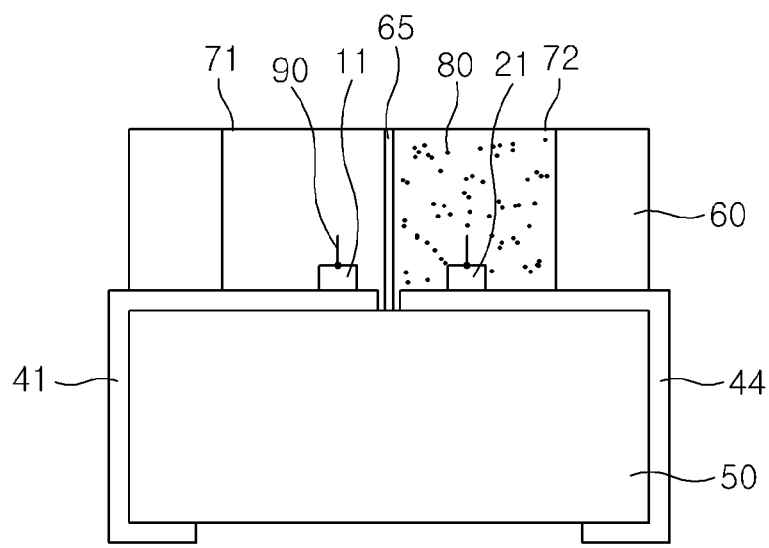
[Fig. 12]

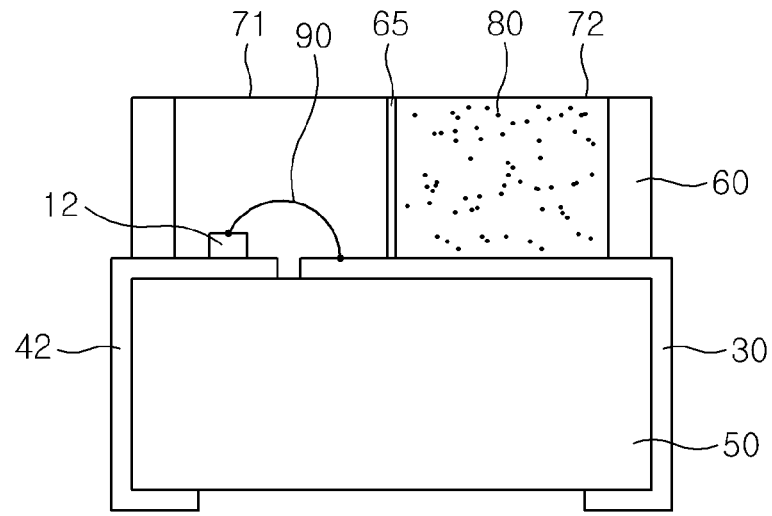
[Fig. 13]
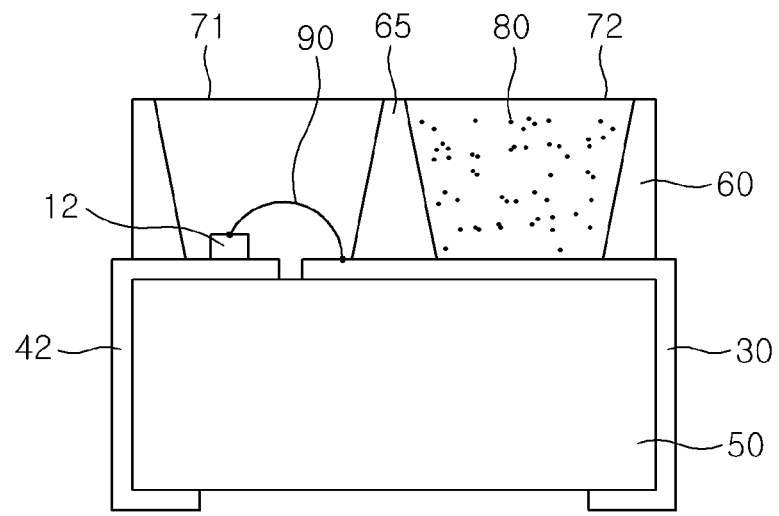
[Fig. 14]

LIGHT EMITTING APPARATUS

CROSS-REFERENCE TO RELATED APPLICATIONS

This application is a National Stage Entry of International Patent Application No. PCT/KR2006/000801, filed Mar. 8, 2006, and claims priority from and the benefit of Korean Patent Application No. 10-2005- 0020846, filed Mar. 14, 2005.

TECHNICAL FIELD

The present invention relates to a light emitting apparatus, and more particularly, to a light emitting apparatus which can be used for not only indicators for use in keyboards, keypads and the like but also flashes for use in supplying a quantity of light required for photographing of camera chips provided in digital cameras and mobile terminals such as mobile phones and PDAs.

BACKGROUND ART

A light emitting diode (LED) refers to a device utilizing a phenomenon in which minority carriers (electrons or holes) injected by means of a p-n junction structure of a semiconductor are produced and light is emitted due to recombination of the carriers. LEDs include a red LED using GaAsP or the like, a green LED using GaP or the like, a blue LED using an InGaN/AlGaN double hetero structure, and the like.

The LED has characteristics of low power consumption, a long lifespan, installation in a narrow space, and strong resistance against vibration. In recent years, white LEDs in addition to single color LEDs, e.g., red, blue or green LEDs, have been appeared. As the white LEDs are applied to products for automobiles and illumination, it is expected that their demands will be rapidly increased.

In LED technology, methods of implementing white are roughly classified into two types. The first one is that red, blue and green LED chips are arranged to be adjacent to one another, and colors of light emitted from the respective devices are mixed to implement white. However, since the respective LED chips have different thermal or temporal characteristics, there are problems in that a uniformly mixed color cannot be implemented due to changes in a color tone according to usage environment, particularly, the occurrence of color spots, or the like.

The second one is that a fluorescent substance is disposed on an LED chip and the color of a portion of first light emitted from the LED chip and the color of second light of which the wavelength is converted by the fluorescent substance are mixed, thereby implementing white. For example, to an LED chip for emitting blue light is attached a fluorescent substance that emits yellowish green or yellow using a portion of the light of the LED chip as an excitation source, so that white can be obtained by means of mixture of the blue light emitted from the LED chip and the yellowish green or yellow light emitted from the fluorescent substance.

FIG. 1 is a schematic view showing a conventional light emitting apparatus.

Referring to this figure, the light emitting apparatus comprises a substrate 5, a plurality of LED chips 1 mounted on the substrate 5, and electrodes 3 and 4 formed to correspond to the LED chips 1. The light emitting apparatus further comprises an upper package 6 formed on the substrate 5 to surround the substrate, and a molding member 7 formed in a hole at the center of the upper package 6 to encapsulate the LED chips 1.

If the LED chips 1 shown in this figure are red, green and blue LED chips, seven colors can be implemented upon application of a current to the LED chips. In general, such a light emitting apparatus is referred to as a seven-color light emitting apparatus. FIG. 2 is a sectional view showing a section taken along line I-I' in a case where the conventional light emitting apparatus employs such three-color light emission and the molding member 7 for encapsulating the LED chips 1 is generally formed of a transparent epoxy resin. In the conventional light emitting apparatus constructed of the red, green and blue LEDs, a variety of colors can be implemented by means of selective electrical connection, and white can also be implemented by means of combination of red, green and blue by simultaneously applying a current to all the electrodes. However, since it is generally hard to achieve an optimal condition for mixture of three colors of light depending on the positions of the chips in view of the configuration of a package, it is difficult to implement perfect white light. Since a color variation is generated due to differences in the light among the LED chips, it is difficult to implement a clear white color of light in a small package. Further, since the respective LED chips have different thermal or temporal characteristics, there are disadvantages in that a uniformly mixed color cannot be implemented due to changes in a color tone according to usage environment, particularly, the occurrence of color spots, or the like, and in that luminance is not high. Thus, since the luminance of white light is considerably low in the seven-color light emitting apparatus, it is not frequently used for emission of white light. Such seven-color light emitting apparatuses are used for indicators and decoration not only in mobile phones but also in general electronic appliances. However, in order to implement white light, it is necessary to additionally provide a white LED capable of implementing a flash function of white light using a blue LED and a fluorescent substance.

In the light emitting apparatus shown in FIG. 1, the respective LED chips 1 described above are constructed of blue LED chips and formed to have a fluorescent substance on the LED chips 1, thereby implementing white light. Such a method of implementing white light using blue LED chips and a fluorescent substance has been popularized at present, and the brightness of the white light is influenced by the number of blue LED chips to be used. FIG. 3 is a sectional view showing a section taken along line I-I' in a case where the conventional light emitting apparatus employs these blue LED chips and a fluorescent substance and the molding member 7 for encapsulating the LED chips 1 is formed of a mixture of a fluorescent substance 8 and an epoxy resin. Accordingly, blue light emitted from the LED chips 1 and light of which the wavelength is converted by the fluorescent substance 8 are mixed, thereby implementing white. Such white LEDs are used for flashes of mobile phones, LCD light sources, and the like.

As described above, in a case where such a seven-color light emitting apparatus is applied to mobile phones and general electronic appliances, it is difficult to implement white light. Since its luminance is very low, an additional white LED for implementing a flash function should be used. Further, since a transparent epoxy resin is generally used as the material of the molding member in case of the seven-color light emitting apparatus, and a mixture of an epoxy resin and a fluorescent substance is generally used as the material of the molding member in case of the white LED using blue LED chips and a fluorescent substance, respective LED packages are separately manufactured and configured due to differences in their configurations and materials.

However, such prior arts have disadvantages in that there is troublesomeness in a process of manufacturing an additional white LED, and respective LED packages are separately manufactured and configured, resulting in an increased exterior size of an apparatus. Accordingly, there is a need for a package integration design and manufacturing technique considering the number of chips, difference in materials, and a circuit configuration.

DISCLOSURE OF INVENTION

Technical Problem

The present invention is conceived to solve the aforementioned problems. Accordingly, an object of the present invention is to provide a light emitting apparatus, wherein a three-color light emitting device unit and a white light emitting device unit using blue LED chips and a fluorescent substance are constructed into one package to independently implement seven colors of light and white light so that the light emitting apparatus can be used in a variety of fields, and the two light emitting device units are simultaneously implemented to emit white light with high luminous intensity.

Another object of the present invention is to provide a light emitting apparatus, wherein LEDs formed of different materials are constructed into one package, thereby reducing the exterior size of the apparatus and enabling the apparatus to be applied to a variety of fields.

Technical Solution

To achieve these objects, the present invention provides a light emitting apparatus comprising a three-color light emitting device unit including at least three light emitting diode (LED) chips for respectively emitting red, green and blue light; a white light emitting device unit including at least one blue LED chip with a fluorescent substance formed thereon; and a substrate provided with a first electrode connected in common to ends of the LED chips and second electrodes formed to correspond respectively to the LED chips. The fluorescent substance may be dotted with a predetermined thickness to surround top and side surfaces of the blue LED chip of the white light emitting device unit. The apparatus may further comprise an upper package formed on the substrate to surround the LED chips and to have a predetermined inclination at an inner wall of the upper package. The apparatus may further comprise a molding member made of a transparent resin for encapsulating the LED chips.

Furthermore, the present invention provides a light emitting apparatus comprising a plurality of LED chips; a substrate provided with a first electrode connected in common to ends of the plurality of LED chips and second electrodes formed to correspond respectively to the plurality of LED chips; an upper package formed on the substrate to surround the plurality of LED chips and to have a partition crossing the first electrode at the center of the upper package; and a molding member that encapsulates the plurality of LED chips and is divided by the partition of the upper package. Here, the plurality of LED chips may be divided into at least two regions by the partition.

The plurality of LED chips may be divided by the partition into a three-color light emitting device unit and a white light emitting device unit. The three-color light emitting device unit has at least three LED chips for respectively emitting red, green and blue light, while the white light emitting device unit has at least one blue LED chip with a fluorescent substance formed thereon. An inner wall of the upper package may be formed to have a predetermined inclination.

In the light emitting apparatus of the present invention, electrical connection is selectively made in the three-color light emitting device unit to emit respective light with seven colors.

Advantageous Effects

In the light emitting apparatus of the present invention, the three-color light emitting device unit and the white light emitting device unit using blue LED chips and a fluorescent substance are constructed in one package to independently implement respective light with seven colors and white light. Thus, there is an advantage in that the apparatus can be applied to a variety of fields due to the implementation of various light. Further, since the two light emitting device units are simultaneously implemented, white light with high luminance can be obtained and the apparatus can be used as backlights for LCDs.

Further, the light emitting apparatus of the present invention can be used for not only indicators for use in keyboards, keypads and the like but also flashes for use in supplying a quantity of light required for photographing of camera chips provided in digital cameras and mobile terminals such as mobile phones and PDAs.

In addition, in the light emitting apparatus of the present invention, LEDs formed of different materials are constructed in one package by means of a simple method. Thus, there are advantages in that troublesomeness in a process can be reduced and the exterior size of the apparatus can be decreased.

BRIEF DESCRIPTION OF THE DRAWINGS

FIG. 1 is a schematic view showing a conventional light emitting apparatus.

FIG. 2 is a sectional view showing a section taken along line I-I' in a case where the conventional light emitting apparatus employs three-color light emission.

FIG. 3 is a sectional view showing a section taken along line I-I' in a case where the conventional light emitting apparatus employs blue light emitting diode chips and a fluorescent substance.

FIG. 4 is a schematic view showing a light emitting apparatus according to a first embodiment of the present invention.

FIG. 5 is a sectional view showing a section taken along line II-II' in the first embodiment.

FIG. 6 a sectional view showing a section taken along line III-III' in the first embodiment.

FIG. 7 is a schematic view showing a light emitting apparatus according to a second embodiment of the present invention.

FIG. 8 is a sectional view showing a section taken along line IV-IV' in the second embodiment.

FIG. 9 is a sectional view showing a section taken along line V-V' in the second embodiment.

FIG. 10 is a sectional view showing a section taken along line IV-IV' in another example of the second embodiment.

FIG. 11 is a schematic view showing a light emitting apparatus according to a third embodiment of the present invention.

FIG. 12 is a sectional view showing a section taken along line VI-VI' in the third embodiment.

FIG. 13 is a sectional view showing a section taken along line VII-VII' in the third embodiment.

FIG. 14 is a sectional view showing a section taken along line VII-VII' in another example of the third embodiment.

BEST MODE FOR CARRYING OUT THE INVENTION

Hereinafter, preferred embodiments of the present invention will be described in detail with reference to the accompanying drawings. However, the present invention is not limited to the embodiments but may be implemented into different forms. These embodiments are provided only for illustrative purposes and for full understanding of the scope of the present invention by those skilled in the art. Throughout the drawings, like elements are designated by like reference numerals.

FIG. 4 is a schematic view showing a light emitting apparatus according to a first embodiment of the present invention.

Referring to this figure, the light emitting apparatus comprises a substrate 50, electrodes 30 and 41 to 45 formed on the substrate 50, light emitting diode (LED) chips 11, 12 and 13 for respectively emitting red, green and blue light, and blue LED chips 21 and 22 on which a fluorescent substance is dotted. The light emitting apparatus further comprises a molding member 70 for encapsulating the LED chips on the substrate 50.

The electrodes 30 and 41 to 45 comprise a first electrode 30 connected in common to ends of the plurality of LED chips 11, 12, 13, 21 and 22, and second electrodes 41, 42, 43, 44 and 45 formed to respectively correspond to the plurality of LED chips 11, 12, 13, 21 and 22. The electrodes 30 and 41 to 45 formed on the substrate 50 may be formed by means of a printing technique or using an adhesive. The electrodes 30 and 41 to 45 are made of a metallic material, including copper or aluminum with superior electrical conductivity, and the first electrode and the second electrodes are formed to be electrically isolated from one another. The shapes of patterns of the electrodes 30 and 41 to 45 formed on the substrate 50 are not limited to those shown in this figure but may be variously formed depending on mounting positions and configurations of the chips. For example, the number of electrode patterns may vary depending on the number of LED chips.

The plurality of LED chips 11, 12, 13, 21 and 22 are mounted on the second electrodes 41, 42, 43, 44 and 45, respectively, and may be mounted thereon using a silver paste. The LED chips 11, 12, 13, 21 and 22 are connected in common to the first electrode 30 through wires 90.

The plurality of LED chips 11, 12, 13, 21 and 22 of the first embodiment can be divided into a three-color light emitting device unit 10 comprising the LED chips 11, 12 and 13 for respectively emitting red, green and blue light, and a white light emitting device unit 20 comprising the blue LED chips 21 and 22 on which a fluorescent substance is dotted. The three-color light emitting device unit 10 can implement seven colors depending on combinations of the LED chips. For example, in a case where the LED chips individually emit light, red, green and blue light can be emitted and it is also possible to emit pink, yellow and sky blue light by means of combinations of red and blue, red and green, and blue and green, respectively. Further, white light with low luminance can be emitted by means of a combination of red, green and blue. In such combinations of colors of the three-color light emitting device unit 10, a diffusing agent may be included such that the respective original colors can be easily mixed. Further, the white light emitting device unit 20 can implement white light by means of a combination of blue light emitted from the LED chips and light of which the wavelength is converted by the fluorescent substance. Furthermore, light with a desired color can be implemented by means of seven colors of the three-color light emitting device unit 10 and various color combinations of the white light emitting device unit 20.

The mounting positions of the respective LED chips are not limited to those in this figure but may be variously arranged depending on, for example, an optimal position for mixture of the three colors of light or the number of LED chips.

As can be seen in FIGS. 5 and 6 showing sections taken along lines II-II' and III-III' in the first embodiment, respectively, a fluorescent substance 80 dotted with a predetermined thickness is formed on the blue LED chip 21 of the white light emitting device unit 20. The fluorescent substance 80 may be dotted on the blue LED chip 21 in a state where it is mixed in a curable resin, e.g., an epoxy or silicone resin. Thus, the color of first light emitted from the blue LED chip 21 and the color of second light of which the wavelength is converted by the fluorescent substance 80 are mixed, thereby implementing light with a color falling within a desired spectrum range.

Further, a molding member 70 for encapsulating the LED chips 11 and 12 are formed on the substrate 50. The molding member 70 may be formed of a predetermined transparent epoxy resin through an injection molding process. Alternatively, the molding member 70 may be formed through preformation thereof using an additional mold and subsequent pressurization or heat treatment thereof. The molding member 70 may be formed in various shapes such as an optical lens shape, a flat plate shape, and a shape with surface irregularities.

In the light emitting apparatus, electrical connection can be made to each of the plurality of LED chips 11, 12, 13, 21 and 22 in one package. Thus, it is possible to independently drive the three-color light emitting device unit 10 and the white light emitting device unit 20. For example, if a negative (−) voltage is applied to the first electrode 30 as the common electrode and a positive (+) voltage is applied to the second electrode 41 with the red LED chip 11 connected thereto in the three-color light emitting device unit 10, it is possible to obtain emission of red light. Further, if a negative (−) voltage is applied to the first electrode 30 as the common electrode and a positive (+) voltage is simultaneously applied to the second electrodes 41 and 42 with the red and green LED chips 11 and 12 connected respectively thereto in the three-color light emitting device unit 10, it is possible to obtain emission of yellow light by means of a combination of red and green. Furthermore, if a negative (−) voltage is applied to the first electrode 30 as the common electrode and a positive (+) voltage is simultaneously applied to the second electrodes 41, 42 and 43 with the red, green and blue LED chips 11, 12 and 13 connected respectively thereto in the three-color light emitting device unit 10, it is possible to obtain emission of white light by means of a combination of red, green and blue. As such, this embodiment can obtain the effects of the three-color light emitting device unit 10 in which it is possible to obtain individual light emission of each of the LED chips and emission of light with various colors resulting from emission of light with mixed colors due to combinations of the LED chips. Further, in the white light emitting device unit 20, if a negative (−) voltage is applied to the first electrode 30 as the common electrode and a positive (+) voltage is applied to the second electrodes 44 and 45 with the blue LED chips 21 and 22 of the white light emitting device unit 20 connected respectively thereto, it is possible to obtain emission of white light. At this time, the brightness of the emitted white light can be controlled depending on the number of blue LED chips. As such, this embodiment can obtain the effects of the white light emitting device unit 20 in which more uniform and clearer white light can be obtained as compared with that obtained by means of mixture of light with three colors.

In addition, since electrical connection can be made to all the electrode patterns on which the plurality of LED chips are mounted, the three-color light emitting device unit 10 and the white light emitting device unit 20 are simultaneously driven, thereby obtaining white light with higher luminance.

Therefore, as a light emitting apparatus having emission of light with various colors and more enhanced optical characteristics is manufactured, it can be applied to a variety of fields and serve as a multi-functional LED in one package. Further, since the light emitting apparatus is constructed of one package rather than separate packages in the prior art, there are advantages in that troublesomeness in a process can be reduced and the exterior size of the apparatus can be decreased.

FIG. 7 is a schematic view showing a light emitting apparatus according to a second embodiment of the present invention.

Referring to this figure, the light emitting apparatus comprises a substrate 50, electrodes 30 and 41 to 45 formed on the substrate 50, light emitting diode chips 11, 12 and 13 for respectively emitting red, green and blue light, and blue LED chips 21 and 22 on which a fluorescent substance is dotted. The electrodes 30 and 41 to 45 comprise a first electrode 30 connected in common to ends of the plurality of LED chips 11, 12, 13, 21 and 22, and second electrodes 41, 42, 43, 44 and 45 formed to correspond respectively to the plurality of LED chips 11, 12, 13, 21 and 22. The plurality of LED chips 11, 12, 13, 21 and 22 are mounted on the second electrodes 41, 42, 43, 44 and 45, respectively, and are connected in common to the first electrode 30 through wires. Since this configuration is almost identical with that of the first embodiment, a detailed description thereof will be substituted by the previous description in connection with FIGS. 4 to 6. However, the light emitting apparatus of the second embodiment further includes an upper package 60 formed to surround the LED chips 11, 12, 13, 21 and 22 on the substrate 50, and a molding member 70 formed by filling a central hole of the upper package 60 with a liquid epoxy resin or the like and thermally curing the epoxy resin for a predetermined period of time so as to protect the LED chips 11, 12, 13, 21 and 22.

As described above, the plurality of LED chips 11, 12, 13, 21 and 22 can be divided into a three-color light emitting device unit 10 comprising the LED chips 11, 12 and 13 for respectively emitting red, green and blue light, and a white light emitting device unit 20 comprising the blue LED chips 21 and 22 on which a fluorescent substance is dotted.

The electrode patterns and the mounting positions of the respective LED chips are not limited to those shown in this figure but may be variously arranged depending on, for example, an optimal position for mixture of light with three colors or the number of LED chips.

As can be seen in FIGS. 8 and 9 showing sections taken along line IV-IV' and V-V' in the second embodiment, respectively, a fluorescent substance 80 dotted with a predetermined thickness is formed on the blue LED chip 21 of the white light emitting device unit 20. The fluorescent substance 80 may be dotted on the blue LED chip 21 in a state where it is mixed in a curable resin, e.g., an epoxy or silicone resin. Thus, the color of first light emitted from the blue LED chips 21 and 22 and the color of second light of which the wavelength is converted by the fluorescent substance 80 are mixed, thereby implementing light with a color falling within a desired spectrum range.

Further, the upper package 60 is formed on the substrate 50, and the molding member 70 for encapsulating the LED chips 11, 12, 13, 21 and 22 is then formed in the central hole of the upper package 60. At this time, to enhance the luminance and light-focusing performance of light, an inner wall of the upper package 60 surrounding the LED chips 11, 12, 13, 21 and 22 may be formed to have a predetermined inclination, as shown in FIG. 10. This is desirable to maximize reflection of light emitted from the LED chips 11, 12, 13, 21 and 22, and increase light emitting efficiency.

In the second embodiment, since electrical connection can be made to each of the plurality of LED chips 11, 12, 13, 21 and 22 in one package in the same manner as described above, it is possible to independently drive the three-color light emitting device unit 10 and the white light emitting device unit 20. Thus, it is possible to simultaneously implement both the effects of the three-color light emitting device unit 10 in which emission of light with various colors can be obtained and the effects of the white light emitting device unit 20 in which uniform and clear white light can be obtained. In addition, since electrical connection can be made to all the electrode patterns on which the plurality of LED chips are mounted, the three-color light emitting device unit 10 and the white light emitting device unit 20 are simultaneously driven, thereby obtaining white light with higher luminance.

Therefore, as a light emitting apparatus having emission of light with various colors and more enhanced optical characteristics is manufactured, it can be applied to a variety of fields and serve as a multi-functional LED in one package. Further, since the light emitting apparatus is constructed of one package rather than separate packages in the prior art, there are advantages in that troublesomeness in a process can be reduced and the exterior size of the apparatus can be decreased.

FIG. 11 is a schematic view showing a light emitting apparatus according to a third embodiment of the present invention.

Referring to this figure, the light emitting apparatus comprises a substrate 50, electrodes 30 and 41 to 45 formed on the substrate 50, light emitting diode chips 11, 12 and 13 for respectively emitting red, green and blue light, and blue LED chips 21 and 22 on which a fluorescent substance is dotted. The electrodes 30 and 41 to 45 comprise a first electrode 30 connected in common to ends of the plurality of LED chips 11, 12, 13, 21 and 22, and second electrodes 41, 42, 43, 44 and 45 formed to correspond respectively to the plurality of LED chips 11, 12, 13, 21 and 22. The light emitting apparatus further comprises an upper package 60 formed to surround the LED chips 11, 12, 13, 21 and 22 on the substrate 50. This configuration is almost identical with that of the second embodiment. However, the light emitting apparatus of the third embodiment further includes a partition 65 crossing the first electrode 30 at the center of the upper package 60. Furthermore, the light emitting apparatus of the third embodiment further includes molding members 71 and 72 for encapsulating the LED chips 11, 12, 13, 21 and 22 on the substrate 50. The molding members 71 and 72 can be individually formed through isolation by the partition 65 of the upper package 60.

The plurality of LED chips 11, 12, 13, 21 and 22 are mounted on the second electrodes 41, 42, 43, 44 and 45, respectively, and are connected in common to the first electrode 30 through wires. The plurality of LED chips 11, 12, 13, 21 and 22 can be divided into a three-color light emitting device unit 10 comprising the LED chips 11, 12 and 13 for respectively emitting red, green and blue light, and a white light emitting device unit 20 comprising the blue LED chips 21 and 22 on which a fluorescent substance is dotted. A detailed description thereof will be substituted by the previous description in connection with FIGS. 4 to 6. It will be apparent that the kinds and number of a plurality of LED chips are not limited to those described above but may vary to emit light with a desired color.

Further, the electrode patterns and the mounting positions of the respective LED chips are not limited to those shown in this figure but may be variously arranged depending on, for example, an optimal position for mixture of light with three colors or the number of LED chips.

On the substrate 50 is provided the upper package 60 formed to surround the LED chips 11, 12, 13, 21 and 22 and to include the partition 65 crossing the first electrode 30 at the center of the upper package 60. Since the partition 65 of the upper package 60 allows the formation of the first electrode 30 as the common electrode at both sides thereof, and the plurality of LED chips 11, 12, 13, 21 and 22 are mounted respectively on the second electrodes 41 to 45, electrical connection can be selectively made to the second electrodes 41 to 45 regardless of the partition 65, thereby independently implementing the respective LED chips 11, 12, 13, 21 and 22. Further, the partition 65 enables the plurality of LED chips 11, 12, 13, 21 and 22 to be separated as desired and the molding members 71 and 72 to be independently formed. Thus, LEDs formed of different materials can be constructed in one package.

For example, as can be seen in FIGS. 12 and 13 showing sections taken along line VI-VI' and VII-VII' in the third embodiment, respectively, separate molding members may be formed on the three-color light emitting device unit 10 and the white light emitting device unit 20. That is, the first molding member 71 may be formed on the three-color light emitting device unit 10 isolated by the partition 65 of the upper package 60 by filling and curing a transparent epoxy resin thereon. On the other hand, the second molding member 72 may be separately formed on the blue LED chip 21 of the white light emitting device unit 20 isolated by the partition 65 of the upper package 60 by using a mixture of the fluorescent substance 80 and an epoxy resin. Thus, the color of first light emitted from the blue LED chip 21 and the color of second light of which the wavelength is converted by the fluorescent substance 80 uniformly distributed in the second molding member 72 are mixed, thereby implementing light with a color falling within a desired spectrum range.

By forming the light emitting apparatus in such a manner using the upper package 60 having the partition 65, LEDs formed of different materials can be constructed in one package by means of a simple method. Accordingly, one LED package can be applied to a variety of fields. Further, since the light emitting apparatus is constructed of one package rather than separate packages in the prior art, there are advantages in that troublesomeness in a process can be reduced and the exterior size of the apparatus can be decreased.

Moreover, to enhance the luminance and light-focusing performance of light, inner walls of the partition 65 and the upper package 60 surrounding the LED chips 11, 12, 13, 21 and 22 may be formed to have a predetermined inclination, as shown in FIG. 14. This is desirable to maximize reflection of light emitted from the LED chips, and increase light emitting efficiency.

In the third embodiment, since electrical connection can be made to each of the plurality of LED chips 11, 12, 13, 21 and 22 in one package in the same manner as described above, it is possible to independently drive the three-color light emitting device unit 10 and the white light emitting device unit 20. Thus, it is possible to simultaneously implement both the effects of the three-color light emitting device unit 10 in which emission of light with various colors can be obtained and the effects of the white light emitting device unit 20 in which uniform and clear white light can be obtained. In addition, since electrical connection can be made to all the electrode patterns on which the plurality of LED chips are mounted, the three-color light emitting device unit 10 and the white light emitting device unit 20 are simultaneously driven, thereby obtaining white light with higher luminance.

Therefore, as a light emitting apparatus having emission of light with various colors and more enhanced optical characteristics is manufactured, it can be applied to a variety of fields and serve as a multi-functional LED in one package. Further, since the light emitting apparatus is simply constructed of one package rather than separate packages in the prior art, there are advantages in that troublesomeness in a process can be reduced and the exterior size of the apparatus can be decreased.

Thus, the light emitting apparatus of the present invention can be used for not only indicators for use in keyboards, keypads and the like but also flashes for use in supplying a quantity of light required for photographing of camera chips provided in digital cameras and mobile terminals such as mobile phones and PDAs.

Although the present invention has been described in connection with the preferred embodiments, it will be readily understood by those skilled in the art that various modifications and changes can be made thereto without departing from the spirit and scope of the present invention defined by the appended claims.

The invention claimed is:
1. A light emitting apparatus, comprising:
a substrate having a support surface having a first side opposing a second side;
a three-color light emitting device disposed on the first side of the support surface and comprising red, green, and blue light emitting diode (LED) chips;
a white light emitting device disposed on the second side of the support surface and comprising second blue LED chips;
a first electrode disposed on the first side and the second side of support surface and electrically connected to each of the LED chips;
second electrodes disposed on the first side of the support surface surrounding the first electrode, each second electrode disposed on and electrically connected to a respective one of the LED chips of the three-color light emitting device;
third electrodes disposed on the second side of the support surface and surrounding the first electrode, each third electrode disposed on and electrically connected to a respective one of the second blue LED chips;

a molding member encapsulating the light emitting devices; and a fluorescent substance selectively dispersed in the molding member, and localized around the second blue LED chips of the white light emitting device, wherein the molding member completely covers at least two LED chips.

2. The apparatus as claimed in claim 1, wherein the fluorescent substance is dotted with a predetermined thickness to surround top and side surfaces of the respective one of the second blue LED chips.

3. The apparatus as claimed in claim 2, wherein the three-color light emitting device is configured to emit seven different colors of light.

4. The apparatus as claimed in claim 1, further comprising an upper package formed on the substrate and around the LED chips, the upper package having an inclined inner wall.

5. The apparatus as claimed in claim 4, wherein the three-color light emitting device is configured to emit seven different colors of light.

6. The apparatus as claimed in claim 1, wherein the molding member comprises a transparent resin.

7. The apparatus as claimed in claim 6, wherein the three-color light emitting device is configured to emit seven different colors of light.

8. The apparatus as claimed in claim 1, wherein the three-color light emitting device is configured to emit seven different colors of light.

9. The apparatus as claimed in claim 1, wherein the first electrode extends around a first edge of the substrate, and at least one of the third electrodes also extends around on the first edge of the substrate.

10. The apparatus as claimed in claim 9, wherein only the second electrodes extend around an opposing second edge of the substrate.

11. The apparatus as claimed in claim 9, wherein two of the third electrodes are disposed on opposing sides of the first electrode on the first edge of the substrate.

12. The apparatus as claimed in claim 11, wherein:

the first electrode extends from the first edge of the substrate to a central portion of the support surface of the substrate;

one of the second electrode extends from an opposing second edge of the substrate towards the first electrode; and the remaining second electrodes are disposed on opposing sides of the second electrode and extend from the second edge of the substrate.

13. The apparatus as claimed in claim 1, wherein at least one of the second electrodes is disposed on the substrate adjacent to the first electrode in a first direction, and at least one other second electrode is not adjacent to the first electrode in the first direction.

14. The light emitting apparatus of claim 1, wherein the first electrode is surrounded by three second electrodes and two third electrodes.

15. The light emitting apparatus of claim 14, wherein three second electrodes extend around a first edge of the substrate, and the first and third electrodes extend around a second edge of the substrate opposite the first edge of the substrate.

* * * * *